United States Patent [19]

Flammer et al.

[11] 4,142,288

[45] Mar. 6, 1979

[54] METHOD FOR CONTACTING CONTACT AREAS LOCATED ON SEMICONDUCTOR BODIES

[75] Inventors: Wieland Flammer, Cleebronn; Roland Weber, Heilbronn-Bockingen; Gerhard Weiher, Brackenheim; Jakob Troner, Heilbronn-Bockingen, all of Fed. Rep. of Germany

[73] Assignee: Licentia Patent-Verwaltungs-G.m.b.H., Frankfurt am Main, Fed. Rep. of Germany

[21] Appl. No.: 771,513

[22] Filed: Feb. 24, 1977

[30] Foreign Application Priority Data

Feb. 28, 1976 [DE] Fed. Rep. of Germany ....... 2608250

[51] Int. Cl.² .............................................. H01R 43/02
[52] U.S. Cl. ...................................... 29/628; 29/591; 228/4.5; 228/173 E; 228/155; 228/180 R
[58] Field of Search .......................... 29/589, 591, 628; 228/4.5, 180 R, 180 A, 173 E, 173 F, 155

[56] References Cited

U.S. PATENT DOCUMENTS

| 3,103,137 | 9/1963 | Charschan | 228/4.5 |
| 3,581,387 | 6/1971 | Buck et al. | 29/591 |
| 3,941,298 | 3/1976 | Nicklaus | 228/4.5 X |
| 4,068,371 | 1/1978 | Miller | 29/628 |

*Primary Examiner*—Carl E. Hall
*Attorney, Agent, or Firm*—Spencer & Kaye

[57] ABSTRACT

A method of contacting metallic contact areas located on semiconductor bodies comprises passing wires through capillary openings into contact with the connecting contacts and fixing them thereto, severing the wires at predetermined distance from the contact areas and bending the separated wires to enable them to be connected to further connecting parts.

The invention also includes a device suitable for carrying out this method.

8 Claims, 5 Drawing Figures

METHOD FOR CONTACTING CONTACT AREAS LOCATED ON SEMICONDUCTOR BODIES

BACKGROUND OF THE INVENTION

In many cases thin contacting wires are used in order to connect the package leads to the metallic contact areas on the surface of a semiconductor body. Thus, in a known contacting system the wire is unwound from a supply reel and is fed through the bore of a capillary. The end of the wire projecting from the tip of the capillary, which end is formed in many cases in the shape of a ball, is then aligned onto the surface of the contact area of the semiconductor body while under microscopic observation with the aid of so-called micromanipulators and is firmly connected to the contact area by thermocompression. Thus the wire, which usually comprises gold, is pressed on to the assigned contact area of the semiconductor body at temperatures of approximately 350° C. A contact which is of high value electrically and is mechanically stable is formed by deforming the ball into a nailhead thermocompression bond. Then in the known method the capillary is raised from the semiconductor surface and passed to a package lead to which the contacting wire is firmly mechanically connected in a second thermocompression step. The capillary is then raised an appropriate distance, and a flame is used to sever the wire and also to form a new ball below the capillary opening. This method of lead attachment is generally designated as "nailhead thermocompression bonding".

In the described method of contacting, which is advantageous in itself, each metallic contact area arranged on the semiconductor surface must be connected to its associated package lead in a special operating process. As the surfaces of the contact areas are extremely small, each contacting step requires a new manual adjustment and a largely manual control of the contacting process.

SUMMARY OF THE INVENTION

It is an object of the invention to provide a method of contacting by means of which several contacts may be manufactured in one time period and by means of which at least one part of the operating step may be automated.

According to one aspect of the invention, there is provided a method of contacting contact areas located on semiconductor bodies comprising passing wires through capillary openings into contact with the contact areas, connecting said wires to the contact areas by thermocompression, severing said wires at a predetermined distance from the contact areas, and bending said wires towards further connecting parts to enable the free ends of said wires to be connected to said further connecting parts.

Further according to this aspect of the invention, there is provided a method of contacting metallic contact areas located on semiconductor bodies having connecting wires passed through a capillary, characterized in that at least the ends of two connecting wires passed through capillary openings are connected to two metallic contact areas located on one surface of the semiconductor body by means of thermocompression; that the wires are severed at a certain distance from the metallic contact areas and are bent towards further connecting parts so that the free wire ends may be firmly connected thereto.

According to a second aspect of the invention, there is provided a device for carrying out contacting of contact areas located on semiconductor bodies comprising capillary devices through which wires are passable and which are movable between a first position for contacting the wires with the contact areas for connection thereto and a second position spaced from said first position, means for severing said wires below the capillary bores when said capillary devices are in said second position, and means for bending the separated wires in a direction to enable connection of the free ends of said wires to further connecting parts.

BRIEF DESCRIPTION OF THE DRAWINGS

The invention will now be described in greater detail, by way of example with reference to the drawings, in which.

DESCRIPTION OF THE PREFERRED EMBODIMENTS

Figure 1:
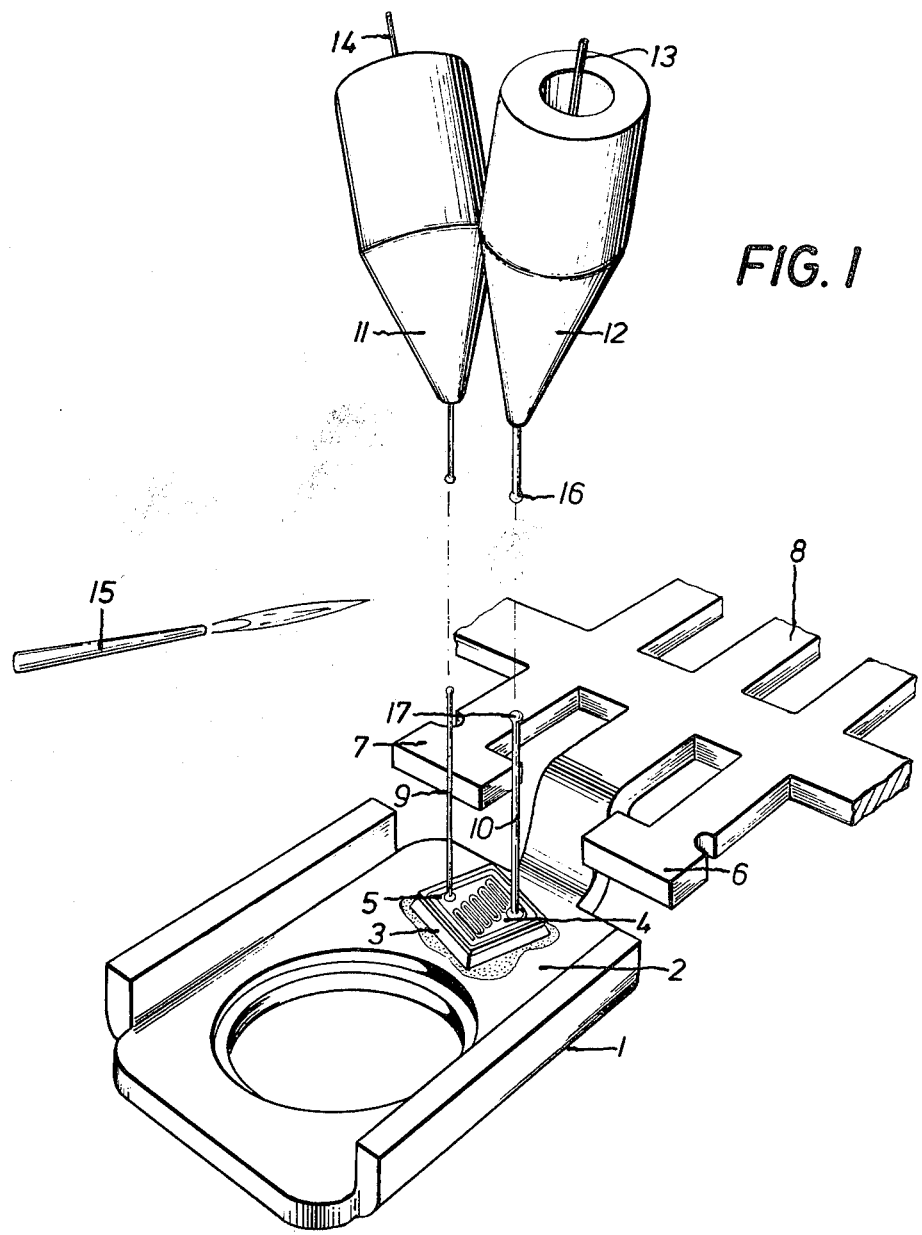
FIG. 1 shows how contacting wires are connected to the contact areas of a semiconductor body in a first operating position.

In a preferred embodiment of the invention a method for contacting metallic contact areas located on semiconductor bodies having connecting wires passed through a capillary, comprises passing at least two ends of two connecting wires through capillary openings and connecting them at the same time to two contact areas located on one surface of the semiconductor body my means of thermocompression, the wires being subsequently severed at a certain distance from the contacts and bending the wires so that the free ends of the wires may be connected firmly to further connecting parts or package leads.

In this method, two or more connecting contacts of a semiconductor component or an integrated semiconductor circuit having connecting wires are contacted in one operation. This is possible because of the fact that a thermocompression device is used which contains several contacting wires passed through different capillary openings or bores. The spacings of the capillary openings and thus the spacings between the wires themselves must correspond exactly to the spacings between the metallic contact areas on the semiconductor surface which should be attached in one operation. As a result of this measure, the thermocompression device for the purpose of contacting several contact areas only has to be adjusted onto the semiconductor arrangement once.

As the connecting parts, to which the contact areas on the semiconductor body are to be connected by means of the contacting wires, have larger spacings than the contact areas on the semiconductor surface, then the connecting wires cannot be contacted with these connecting parts with the thermocompression device, which is used for connecting the connecting wires to the contact areas on the semiconductor body.

Thus in an advantageous aspect of the method in accordance with the invention, the capillary is raised up to a certain distance above the semiconductor surface after the connecting wires have been fixed to the metallic contact areas on the semiconductor body. Then the wires are burnt away below the capillary openings. A wedge is then passed between the pieces of wire projecting above the surface of the semiconductor body, said wedge at the same time spreading apart and bending the wires so that the free ends of the wires come into contact with the associated package leads, for example with the prongs or connecting parts of a contact strip. Finally, these free ends of wire are connected firmly to the package leads by thermocompression with the aid of a pressure means.

The method may be carried out in a particularly rational manner if the wires are fixed to the contact areas of the semiconductor body in a first arrangement in a first operating position and at the same time the wires projecting high above the semiconductor surface are spread out and bent in a second operating position in a second arrangement. At the same time, in a third operating position with a third semiconductor arrangement, the connection of the free ends of the wires to the connecting parts or package leads of the casing is carried out by means of a second thermocompression device. Spreading out, bending and fixing the wires to the associated connecting parts may take place fully automatically so that, in order to fix the wires to the metallic contact areas on the semiconductor surface, only one manual adjustment is necessary which is carried out under observation.

The method is preferably carried out with a device in which two or more capillaries are fixed together so that the spacing between the capillary openings is identical to the spacing between the associated contact areas on the semiconductor body. This is possible particularly if it is a question of contacting power transistors in which the contact areas have a relatively large spacing from each other. With other semiconductor components, particularly with high-frequency transistors and in integrated circuits, the contact areas however lie very close together on the semiconductor surface. Specially constructed capillaries are used for the connection of these closely adjacent contact areas. Thus, for example, it may be a question of two or more L-shaped support arms placed against one another, in which the capillary opening is located respectively at the outermost tip of the horizontal part. These tips may be set to a very small spacing so that in this way very small spacings are maintained between the capillary openings. This type of contacting device is particularly advantageous if the support arms may be swung outwardly to the side. Thus when raising the capillaries, a horizontal movement component, and thus a component running parallel to the semiconductor surface, is additional to the vertical component. As a result of the horizontal movement component, there is spreading of the contacting wires after fixing to the metallic contact areas on the semiconductor surfaces.

Referring now to the drawings, FIG. 1 shows, in perspective view, how the base and emitter contact area of a power transistor is contacted simultaneously with one connection wire each. The transistor package comprises a metal plate 1, the semiconductor body 3 being fixed to its inner surface 2. This takes place for example by means of soldering so that the collector region of the transistor is electrically connected to the package part 1 directly. The metal plate 1 is later cast in plastic together with the transistor element and thin contacting wires so that damage to the vulnerable components is no longer possible.

The contacting wires 13 and 14 are fed through two capillaries 11 and 12. The outlet openings of these capillaries 11 and 12 have a spacing which corresponds exactly to the spacing between the emitter-metal contact 4 and the base-metal contact 5. The ends 16 of the wires projecting out the capillary openings have the form of balls so that the wires cannot slip out of the capillaries.

These wires are adjusted onto the contact areas 4 and 5 with their balls 16 by means of the capillary tips and are pressed against these contact areas during simultaneous heating. As a result a mechanically firm thermocompression bond is formed. Then the capillaries, as is shown in FIG. 1, are raised and the wires are cut with the aid of a flame device 15. In this way the ends 16 of the connecting wires projecting out of the capillary openings again are formed to balls as do the free ends 17 of the wire pieces 9 and 10 connected to the semiconductor body.

These wire pieces 9 and 10 project high above the semiconductor surface almost parallel to one another and must be connected to the associated connected parts 6 and 7 of a structured contact strip 8. The connecting parts 6 and 7 which are assigned to the emitter or to the base contact of the transistor 3 have the shape of prongs which project from a connecting bar common to the prongs. The contact strip has a plurality of prongs so that numerous transistors may be contacted to one strip. This makes it possible to carry out operating steps simultaneously in adjacent operating positions. The comb-shaped contact strip 8 has three connecting prongs per transistor element, of which the centre one is electrically connected to the connecting wires 9 and 10.

Figure 2:
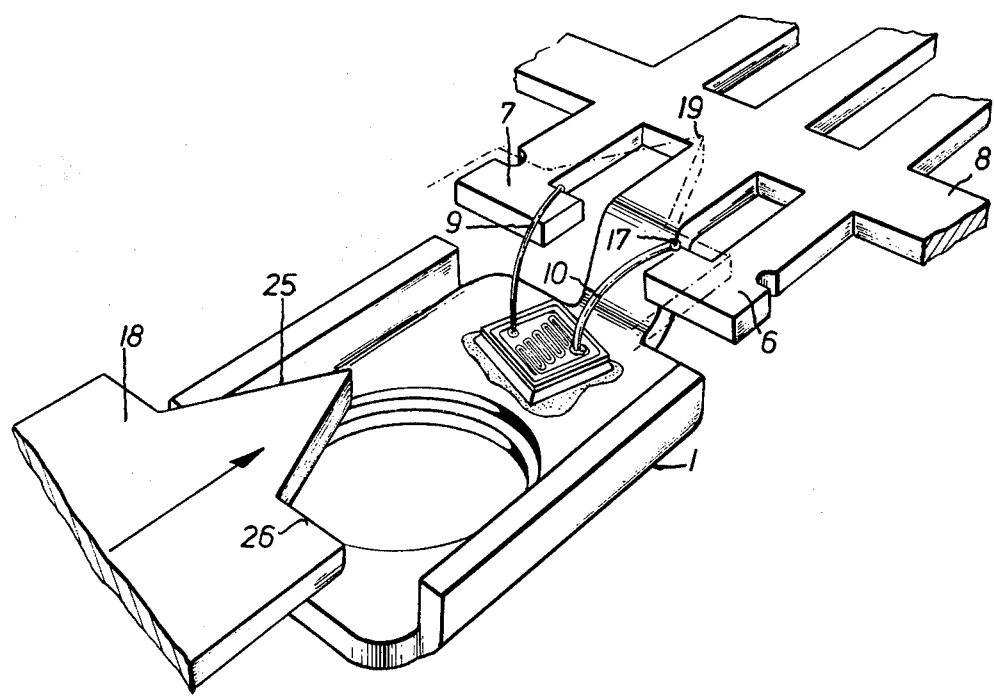
FIG. 2 shows spreading and bending of the contacting wires in a second operating position.

This takes place as may be seen from FIG. 2 in a second operating position. A wedge 18 is passed, in the direction of movement shown, between the projecting wire ends. This wedge spreads the wires 9 and 10 apart with its pointed part 25. The wedge is passed away over the wires 9 and 10 in the indicated direction of movement parallel to the metal plate 1, thus the shoulder parts 26 of the wedge bend the connecting wires 9 and 10 so that the free wire ends 17 come in contact with the connecting prongs 6 and 7. The final position of the wedge is shown in broken lines in FIG. 2 and is numbered 19.

Figure 3:
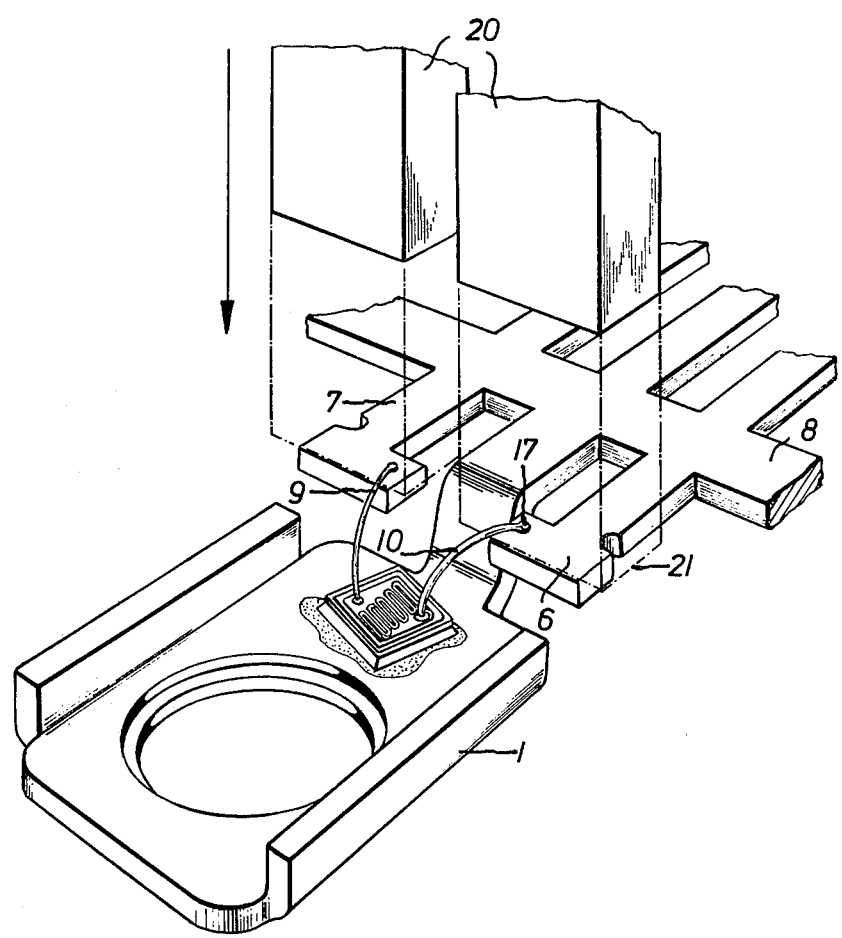
FIG. 3 shows how the contacting wires are firmly attached electrically and mechanically to package leads of the casing in a third operating position.

In accordance with FIG. 3, the connection of the free wire ends 17 to the connecting prongs 6 and 7 of the contact strip 8 is carried out in a third operating position. Thus a double stamp 20 is moved downwards in the direction of the shown arrow so that the end surfaces of this stamp press the wire ends 17 against the prongs 6 and 7. Thus by the resulting wedge-bonding procedure thermocompression connections are achieved which are mechanically fixed. The position of the pressure stamp is shown in FIG. 3, this position being taken up by the pressure stamp during contacting is also shown by broken lines (21) in FIG. 3.

The operating processes shown in FIGS. 2 and 3 may take place fully automatically and may be carried out at a time in which, after manual adjustment, the connection is made with the connecting contact areas on the semiconductor body in accordance with FIG. 1. The contact strip 8 is thus worked simultaneously in three operating positions without additional staff being necessary.

After making all of the necessary contacts, the casing part 1, the transistor 3 and the connecting wires 9 and 10, including the ends of the contacting prongs must be cast into a plastic casing. The individual transistors are separated by dividing up the contact strip in which even the connecting bar between the individual contacting prongs must be separated from each other for the purpose of insulating the connecting parts.

Figure 4:
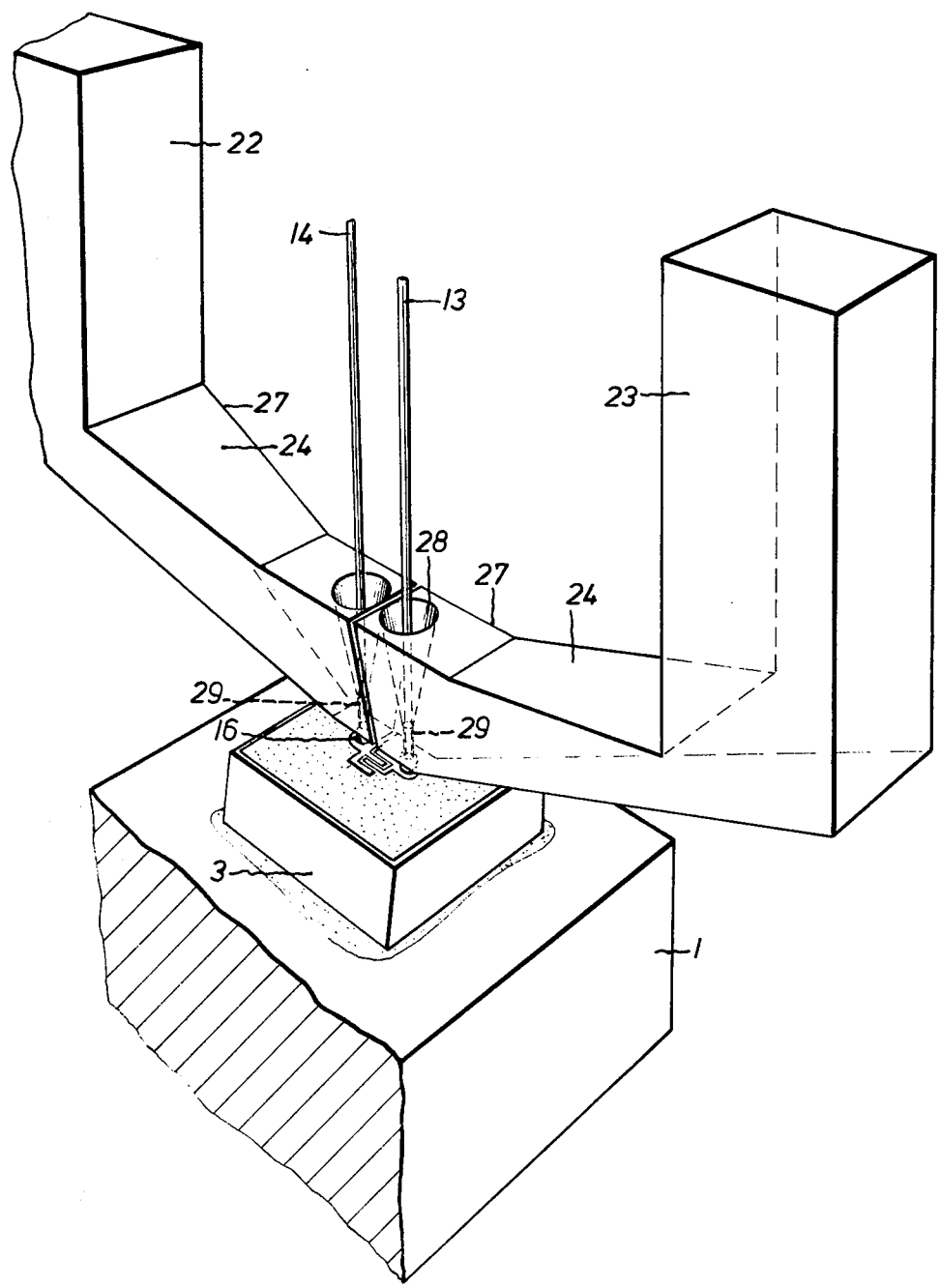
FIG. 4 shows a contacting device having capillaries which may be moved with respect to one another.
Figure 5:
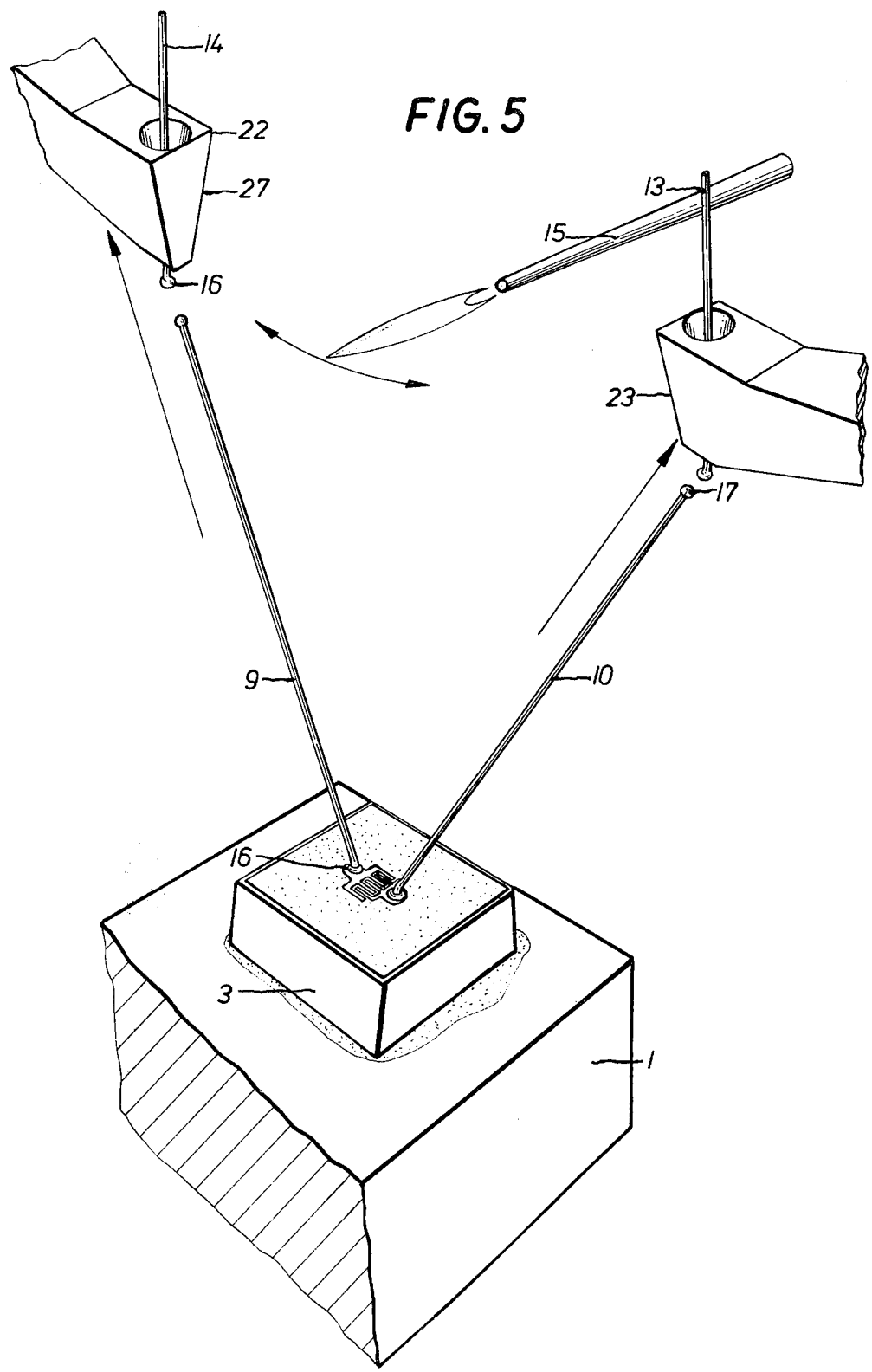
FIG. 5 shows how the contacting wires may be spread with the aid of the contacting device of FIG. 4.

From FIGS. 4 and 5 it may be seen how the semiconductor arrangements may be contacted on the semiconductor surface where the connecting contact areas are closely adjacent. Thus two capillaries 23 and 22 are used which are constructed as L-shaped support arms. The horizontal parts 24 of these support arms are oppositely aligned with one another and contain the capillary bores 28, 29. Thus the contacting wires 13 and 14 are located at the outermost downwardly pointing ends 27 of the supporting arms 24. The openings are conically shaped in the upper parts 28 in order to facilitate the introduction of the contacting wires. The lower part 29 of the bores have only a cross-section such as to safely guide the contacting wires, the cross-section corresponding substantially to the diameter of the wires.

As may be seen from FIG. 4 the support arms 22 and 23 are placed against one another during contacting so that the tips 27 of the horizontal parts 24 are in contact or almost in contact. In this way it is possible to maintain very small spacings between the capillary openings, these corresponding to the small spacings between the metal contact areas on the semiconductor surface.

In accordance with FIG. 5 the support arms 22 and 23 may be swung outwardly to the side in the direction of the shown arrows and may be raised at the same time. Thus the contacting wires 9 and 10 are spread out in the manner shown. In this spread out state, the wires are burnt away below the capillary openings so that the wire ends again form balls 16 or 17. When using this contacting device, spreading of the contacting wires is no longer necessary with the aid of a wedge as the spreading may take place in a definite manner by means of the movement of the capillary arms after contacting has taken place. The contacting wires need, therefore to be transferred only with the aid of a bar, not shown, which is passed parallel to the surface of the support body 1 in order to be able to be connected, in the manner already described, to the associated connecting parts of a package.

While in the embodiments described, only two contacting wires are connected simultaneously, contacting may be carried out in a similar manner where three or more connecting wires are to be connected to contact areas simultaneously.

It will be understood that the above description of the present invention is susceptible to various modification changes and adaptions.

What is claimed is:

1. A method of contacting metallic contact areas located on semiconductor bodies by means of connecting wires each passed through a respective capillary, comprising the steps of: connecting at least the ends of two connecting wires passed through capillary openings to two metallic contact areas located on one surface of the semiconductor body by means of thermocompression; after connecting said connecting wires to said metallic contact areas, removing each capillary to a certain distance above said semiconductor surface; severing said wires by burning same below the capillary openings and at a desired distance from the metallic contact areas; passing a wedge between the pieces of wire connected to the metallic contact areas and projecting from said semiconductor surface, said wedge at the same time spreading out and bending the pieces of wire so that the free wire ends come into contact with associated prongs of a structured contact strip, and finally firmly connecting these free wire ends to said prongs by means of thermocompression with the aid of a pressure device.

2. A method as defined in claim 1, wherein spreading, bending and connecting of said wires to associated ones of said prongs takes place fully automatically.

3. A method for connecting metal connecting contacts disposed on the surface of a semiconductor body with associated housing connecting members by means of connecting wires conducted through a capillary, comprising the steps of: simultaneously connecting the ends of at least two connecting wires brought through capillary openings to two respective metal contacts on the surface of a semiconductor body by thermocompression; after connecting of the connecting wires to the metal contacts, withdrawing the capillaries to a certain distance above the semiconductor surface; severing the wires below the capillary openings; spreading the wires connected to the metal contacts; simultaneously bending the spread wires so that the free wire ends come into contact with the associated housing connecting members; and thereafter firmly connecting said free wire ends, by thermocompression, to the housing connecting members with the aid of a pressure device.

4. A method as defined in claim 3 wherein said step of severing comprises burning the individual wires; and wherein said steps of separating and bending are carried out simultaneously by passing a wedge between the projecting wire pieces.

5. A method as defined in claim 4 wherein said wedge is passed between said wires in a direction parallel to the surface of the semiconductor surface.

6. A method as defined in claim 3 wherein said step of separating is carried out simultaneously with said step of withdrawing.

7. A method as defined in claim 3, wherein connection of said wires to said metallic contact areas of the semiconductor body is carried out in a first arrangement at the same time as spreading and bending of said wires is carried out in a second arrangement and at the same time as connection of said wires to said connecting parts is carried out in a third arrangement in three adjacent operating positions.

8. A method of connecting contact areas located on semiconductor bodies to associated housing connecting members by means of connecting wires comprising: passing a respective connecting wire through each of a pair of capillary openings in a bonding tool; simultaneously connecting said wires to respective contact areas on the upper surface of a semiconductor body by thermocompression using said bonding tool; raising said bonding tool a desired distance from said surface of said semiconductor body; severing said wires below said capillary openings and at a predetermined distance from said semiconductor body to provide two vertically extending wires connected to said respective contact areas; spreading said vertically extending wires and simultaneously bending same to cause the free ends of said vertically extending wires to come into contact with associated housing connection members; and bonding said free ends to said associated housing connection members by thermocompression, using a further bonding tool.

* * * * *